United States Patent
Sheridan et al.

(10) Patent No.: US 7,994,619 B2
(45) Date of Patent: Aug. 9, 2011

(54) BRIDGE STACK INTEGRATED CIRCUIT PACKAGE SYSTEM

(75) Inventors: Richard P. Sheridan, Gilbert, AZ (US); Eric Gongora, Chandler, AZ (US); Douglas J. Mathews, Mesa, AZ (US)

(73) Assignee: Stats Chippac Ltd., Singapore (SG)

( * ) Notice: Subject to any disclaimer, the term of this patent is extended or adjusted under 35 U.S.C. 154(b) by 827 days.

(21) Appl. No.: 11/555,682

(22) Filed: Nov. 1, 2006
(Under 37 CFR 1.47)

(65) Prior Publication Data
US 2008/0111222 A1    May 15, 2008

Related U.S. Application Data

(60) Provisional application No. 60/596,968, filed on Nov. 1, 2005.

(51) Int. Cl.
*H01L 23/02* (2006.01)

(52) U.S. Cl. ............... 257/686; 257/777; 257/E25.006; 438/109

(58) Field of Classification Search .................. 257/666, 257/686, 777, 787, E25.006, E25.013; 438/106, 438/109
See application file for complete search history.

(56) References Cited

U.S. PATENT DOCUMENTS

| | | | |
|---|---|---|---|
| 6,661,083 B2 * | 12/2003 | Lee et al. | ...................... 257/676 |
| 7,049,687 B2 | 5/2006 | Takahashi et al. | |
| 7,061,105 B2 | 6/2006 | Masuda et al. | |
| 7,061,120 B2 | 6/2006 | Shin et al. | |
| 7,061,125 B2 | 6/2006 | Cho et al. | |
| 7,078,264 B2 | 7/2006 | Yang | |
| 7,098,542 B1 * | 8/2006 | Hoang et al. | ................... 257/778 |

* cited by examiner

*Primary Examiner* — Hoai v Pham
(74) *Attorney, Agent, or Firm* — Mikio Ishimaru

(57) ABSTRACT

An integrated circuit package system is provided including mounting a first device on a carrier, mounting a second device over the first device and the carrier in an offset face-to-face configuration, and connecting the first device and the second device at an overlap.

20 Claims, 2 Drawing Sheets

BRIDGE STACK INTEGRATED CIRCUIT PACKAGE SYSTEM

CROSS-REFERENCE TO RELATED APPLICATION(S)

This application claims the benefit of U.S. Provisional Patent Application Ser. No. 60/596,968 filed Nov. 1, 2005.

TECHNICAL FIELD

The present invention relates generally to integrated circuit package systems and more particularly to stacked integrated circuit package systems.

BACKGROUND ART

Across all sectors, industries, and geographies, demands continue for the electronic industry to provide products that are lighter, faster, smaller, multi-functional, more reliable, and more cost-effective. In order to meet these expanding requirements of so many and varied consumers, more electrical circuits need to be more highly integrated to provide the functions demanded. Across virtually all applications, there continues to be growing demand for reducing size, increasing performance, and improving features of integrated circuits.

The seemingly endless restrictions and requirements are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc. As the demand grows for smaller electronic products with more features, manufacturers are seeking ways to include more features as well as reduce the size of the integrated circuits. However, increasing the density of integration in integrated circuits may be expensive and have technical limitations. Though technology continues its growth to once unimagined extents, practical limits of individual integrated circuits do exist.

To meet these needs, three-dimensional type integrated circuit packaging techniques have been developed and used. Packaging technologies are increasingly using smaller form factors with more circuits in three-dimensional packages. In general, package stacks made by stacking packages and stacked chip packages made by stacking chips in a package have been used. Package stacks may be manufactured by stacking packages that have already passed the necessary tests for their functions. Therefore, the yields and reliability of these package stacks may be higher than those stacked chip packages manufactured by stacking chips without being tested. However, the package stacks may be thicker as compared with stacked chip packages, because of the thickness of each individual stacked package.

Stacked packages are also susceptible to warpage causing uneven or missing mounting features or electrical connections. Attempts to provide stacking features have met with difficult to control manufacturing, incompatible, or incongruous materials, as well as insufficient structural integrity. The stacking features must provide both structural and electrical integrity and uniformity in order to provide reliable, high yield and functioning systems. In addition to providing the necessary structural and electrical integrity, the packages must provide an easy mounting process. The easy mounting process requires high yield for finished devices as well as known and economical manufacturing and equipment.

Every new generation of integrated circuits with increased operating frequency, performance and the higher level of large scale integration has underscored the need for back-end semiconductor manufacturing to increase the heat management capability within an encapsulated package. It is well acknowledged that when a semiconductor device becomes denser in term of electrical power consumption per unit volume, heat generated is also increases correspondingly. More and more packages are now designed with an external heat sink or heat slug to enhance the ability of heat being dissipated to the package ambient environment. As the state of the art progresses, the ability to adequately dissipate heat is often a constraint on the rising complexity of package architecture design, smaller footprint, higher device operating speed and power consumption.

As more functions are packed into the integrated circuits and more integrated circuits into the package, more heat is generated degrading the performance, the reliability, and the lifetime of the integrated circuits. As more circuitry is packed into the integrated circuits, the integrated circuit generates more radiated energy called electromagnetic interference (EMI).

Thus, a need still remains for an integrated circuit package system providing low cost manufacturing and improved yield for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including mounting a first device on a carrier, mounting a second device over the first device and the carrier in an offset face-to-face configuration, and connecting the first device and the second device at an overlap.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
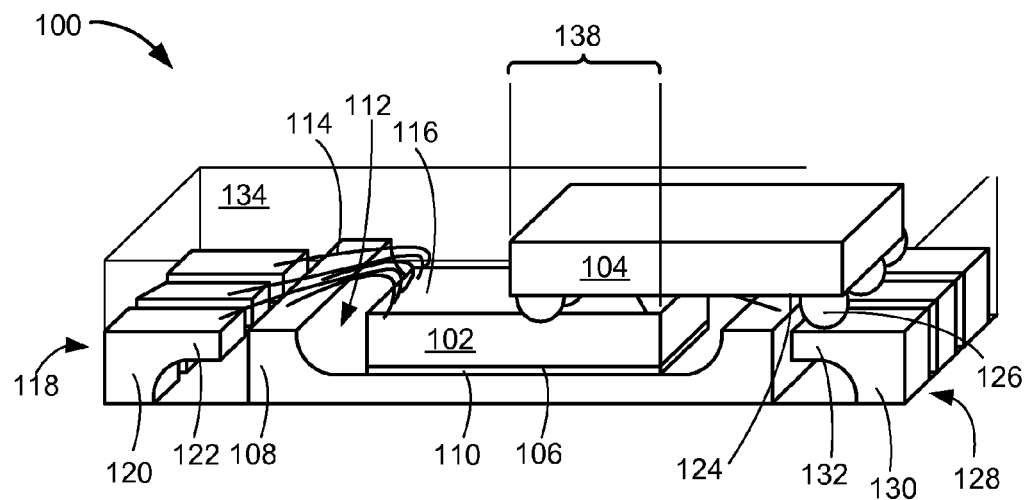
FIG. 1 is an isometric view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure. The term "system" as used herein means and refers to the method and to the apparatus of the present invention in accordance with the context in which the term is used.

Referring now to FIG. 1, therein is shown an isometric view of an integrated circuit package system 100 in an embodiment of the present invention. The integrated circuit package system 100 may represent a package-in-package system or a package system including a stack of devices with a first device 102, such as an integrated circuit die or a packaged device, below a second device 104, such as an integrated circuit die, a flip chip, or a packaged device. The second device 104 and the first device 102 may be the same or the same type, such as functionality or technology, or may be different.

A first non-active side 106 of the first device 102 is attached to a carrier 108, such as a die-attach paddle, with an adhesive 110, such as a die-attach adhesive. The first device 102 is in a recess 112 of the carrier 108. A side of the carrier 108 opposite the first device 102 is exposed to ambient. The carrier 108 may serve multiple functions, such as provide ground sites, function as a heat spreader, provide electromagnetic interference (EMI) shielding, provide a planar rigidity for mitigating warpage, or function as a combination thereof.

First internal interconnects 114, such as bond wires or ribbon bond wires, connect a first active side 116 of the first device 102 and first external interconnects 118, such as leads. Each of the first external interconnects 118 has a first lead body 120 and a first lead tip 122 extending more to the interior of the integrated circuit package system 100 than of the first lead body 120. The first internal interconnects 114 attach to the carrier 108 for ground connections or the first external interconnects 118, each at the first lead tip 122. A portion of the first lead body 120 is exposed for further connections to the next system level (not shown), such as a printed circuit board or another integrated circuit package system.

A second active side 124 of the second device 104 faces the first active side 116. The second device 104 is offset from the first device 102 such that the second device 104 Does not perturb the connections of the first internal interconnects 114 and the first device 102. Second internal interconnects 126, such as solder bumps or solder balls, connect the second active side 124 and the second external interconnects 128. The second internal interconnects 126 also connect the second active side 124 and the first active side 116. The connection of the first active side 116 and the second active side 124 with the second internal interconnects 126 may serve a number of different functions, such as electrical and mechanical bridging of the integrated circute package system 100.

For example, the first active side 116 and the second active side 124 may function as redistribution layers for signal transmission between the first external interconnects 118 and the second external interconnects 128 with the signal traversing through the first internal interconnects 114 and a redistribution layer (not shown) along the first active side 116. The signal transmission traverses through the second internal interconnects 126 between the first device 102 and the second device 104 continuing with a redistribution layer (not shown) along the second active side 124. The signal transmission further continues through the second internal interconnects 126 and the second external interconnects 128.

Another example, the second internal interconnects 126 may serve as a communication path between circuitry (not shown) of the first device 102 and circuitry (not shown) the second device 104. Yet another example, the second device 104 may connect to ground through the second internal interconnects 126, the redistribution layer of the second active side 124, and to the carrier 108 that may be connected to ground. The redistribution layer of the second active side 124 may also function as an EMI shield.

Yet further, the second internal interconnects 126 between the first active side 116 and the second active side 124 may provide a number of communication paths from a number of source and destination with the various paths described above. The second internal interconnects 126 between the first device 102 and the second device 104 also provide structural stacking support.

Each of the second external interconnects 128 has a second lead body 130 and a second lead tip 132. The second internal interconnects 126 attach to the second external interconnects 128, each at the second lead tip 132. The offset of the second device 104 with the first device 102 creates an overhang of the second device 104 over the first device 102, a portion of the carrier 108, and the second lead tip 132. The bridge stack structure has a portion of the second internal interconnects 126 connecting the first device 102 and the second device 104 at an overlap 138 of the first device 102 and the second device 104.

For illustrative purposes, the first device 102 is depicted having bonding pads (not shown) at the peripheral boundary of the first active side 116, although it is understood that the first device 102 may have bonding pads in the interior of the first active side 116, such as an array of bonding pads. Also for illustrative purposes, the first internal interconnects 114 are shown as bond wires, although it is understood that the first internal interconnects 114 may include other types of interconnects, such as solder bumps. Further for illustrative purposes, the second device 104 is depicted having bonding pads (not shown) at the peripheral boundary of the second active side 124, although it is understood that the second device 104 may have bonding pads in the interior of the second active side 124, such as an array of bonding pads.

An encapsulation 134, such as an epoxy mold compound, covers the first device 102, the second device 104, the first internal interconnects 114, and the second internal interconnects 126. The encapsulation 134 partially covers the first external interconnects 118, the second external interconnects 128, and the carrier 108.

The offset configuration of the first device 102 and the second device 104 forms mold lock features. The first lead tip 122, the second lead tip 132, and the recess 112 of the carrier 108 also provide mold lock functions. The interlock features improve performance in moisture level sensitivity (MSL) tests as well as increase structural rigidity. The first device 102 and the second device 104 may tested to verify known good devices (KGD) without assembly of the integrated circuit package system 100.

Figure 2:
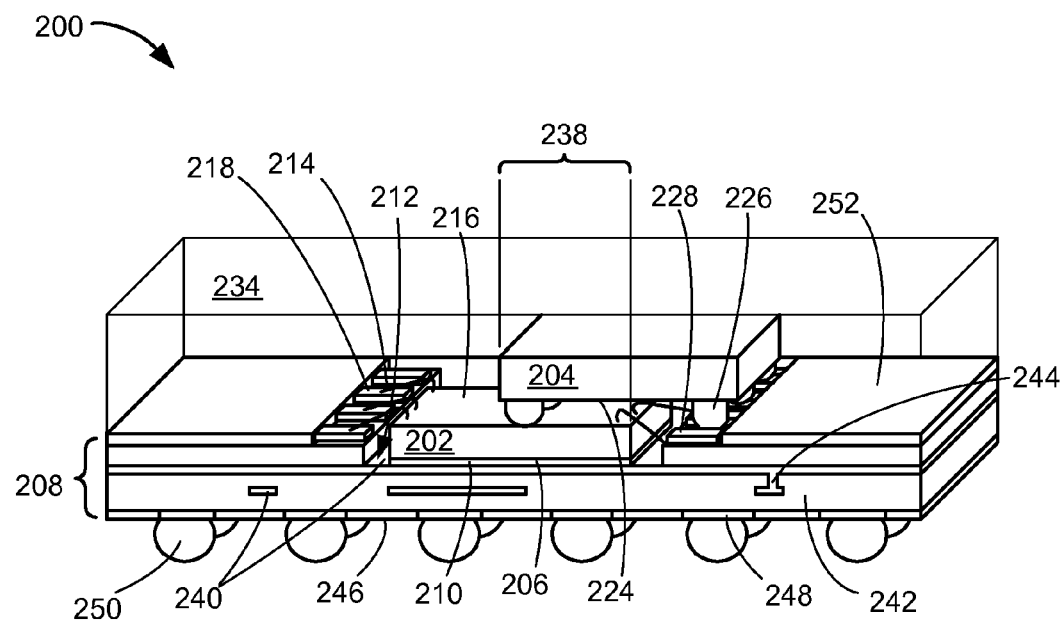
FIG. 2 is an isometric view of an integrated circuit package system in an alternative embodiment of the present invention.

Referring now to FIG. 2, therein is shown an isometric view of an integrated circuit package system 200 in an alternative embodiment of the present invention. The integrated circuit package system 200 may represent a package-in-package system or a package system including a stack of devices with a first device 202, such as an integrated circuit die or a packaged device, below a second device 204, such as an integrated circuit die, a flip chip, or a packaged device. The second device 204 and the first device 202 may be the same or the same type, such as functionality or technology, or may be different.

A first non-active side 206 of the first device 202 is attached on a carrier 208, such as a substrate or a laminate substrate, with an adhesive 210, such a die-attach adhesive. The carrier 208 may have metal layers 240, such as routing layers, separated by insulating layers 242, such as a dielectric layer. Electrical vias 244 may connect the metal layers 240 at predetermined locations through the insulating layers 242. The first device 202 is on one of the metal layers 240 in a recess 212 of the carrier 208.

A bottom surface 246 of the carrier 208 has external terminal pads 248 for attachment with external interconnects 250, such as solder balls, for further connections to the next system level (not shown), such as a printed circuit board or another integrated circuit package system. The carrier 208 may serve multiple functions, such as provide ground sites, function as a heat spreader, provide electromagnetic interference (EMI) shielding, provide a planar rigidity for mitigating warpage, serve as a redistribution path, or function as a combination thereof.

First internal interconnects 214, such as bond wires or ribbon bond wires, connect a first active side 216 of the first device 202 and first bond sites 218, such as lead fingers. The first bond sites 218 are exposed at a top surface 252 of the carrier 208 next to the recess 212. The first internal interconnects 214 attach to the first bond sites 218.

A second active side 224 of the second device 204 faces the first active side 216. The second device 204 is offset from the first device 202 such that the second device 204 does not perturb the connections of the first internal interconnects 214 and the first device 202. Second internal interconnects 226, such as solder bumps or solder balls, connect the second active side 224 and second bond sites 228. The second internal interconnects 226 also connect the second active side 224 and the first active side 216. The connection of the first active side 216 and the second active side 224 with the second internal interconnects 226 may serve a number of different functions, such as electrical and mechanical bridging of the integrated circuit package system 200.

For example, the first active side 216 and the second active side 224 may function as redistribution layer for signal transmission between the first bond sites 218 and the second bond sites 228 with the signal traversing through the first internal interconnects 214 and a redistribution layer (not shown) along the first active side 216. An entire length of the first internal interconnects 214 connected to the first active side 216 and the second bond site 228 are directly under the second device 204. The signal transmission traverses through the second internal interconnects 226 between the first device 202 and the second device 204 continuing with a redistribution layer (not shown) along the second active side 224. The signal transmission further continues through the second internal interconnects 226 and the second bond sites 228.

Another example, the second internal interconnects 226 may serve as a communication path between circuitry (not shown) of the first device 202 and circuitry (not shown) the second device 204. Yet another example, the second device 204 may connect to ground through the second internal interconnects 226, the redistribution layer of the second active side 224, and to the carrier 208 that may be connected to ground. The redistribution layer of the second active side 224 may also function as an EMI shield.

Yet further, the second internal interconnects 226 between the first active side 216 and the second active side 224 may provide a number of communication paths from a number of source and destination with the various paths described above. The first device 202 and the second device 204 may connect to the external interconnects 250 through a number paths described above. The second internal interconnects 226 between the first device 202 and the second device 204 also provide structural stacking support.

The offset of the second device 204 with the first device 202 creates an overhang of the second device 204 over the first device 202, a portion of the recess 212, and the second bond sites 228. The bridge stack structure has a portion of the second internal interconnects 226 connecting the first device 202 and the second device 204 at an overlap 238 of the first device 202 and the second device 204.

For illustrative purposes, the first device 202 is depicted having bonding pads (not shown) at the peripheral boundary of the first active side 216, although it is understood that the first device 202 may have bonding pads in the interior of the first active side 216, such as an array of bonding pads. Also for illustrative purposes, the first internal interconnects 214 are shown as bond wires, although it is understood that the first internal interconnects 214 may include other types of interconnects, such as solder bumps. Further for illustrative purposes, the second device 204 is depicted having bonding pads (not shown) at the peripheral boundary of the second active side 224, although it is understood that the second device 204 may have bonding pads in the interior of the second active side 224, such as an array of bonding pads.

An encapsulation 234, such as an epoxy mold compound, covers the first device 202, the second device 204, the first internal interconnects 214, and the second internal interconnects 226. The encapsulation 234 partially covers the carrier 208.

The offset configuration of the first device 202 and the second device 204 forms mold lock features. The recess 212 of the carrier 208 also provides mold lock functions. The interlock features improve performance in moisture level sensitivity (MSL) tests as well as increase structural rigidity. The first device 202 and the second device 204 may tested to verify known good devices (KGD) without assembly of the integrated circuit package system 200.

Figure 3:
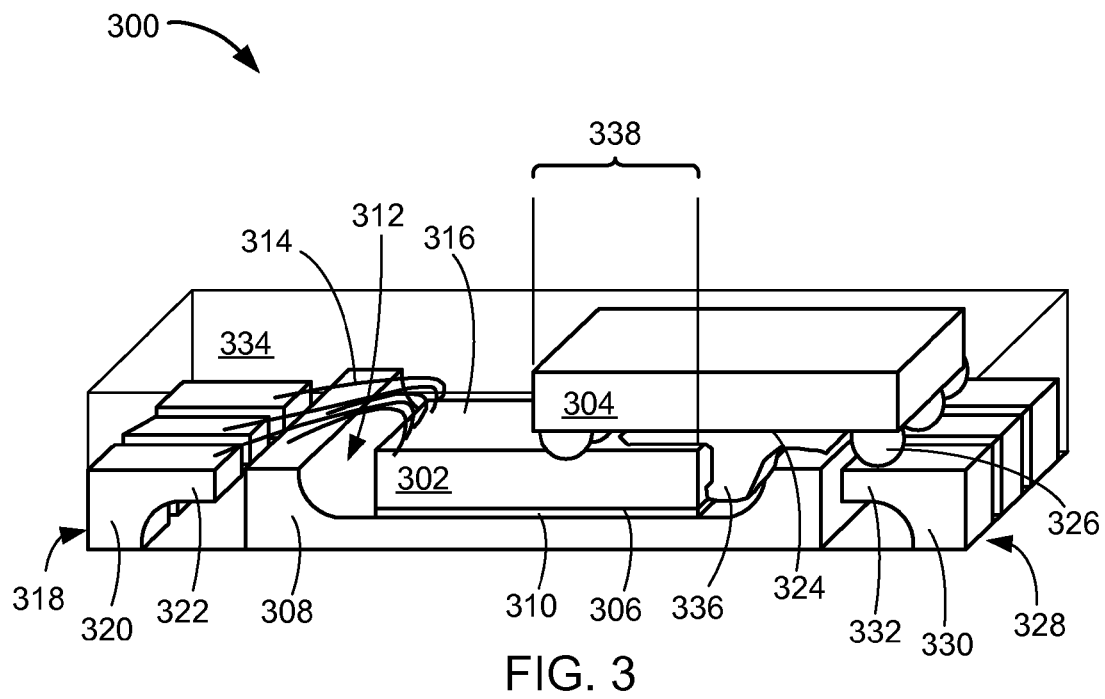
FIG. 3 is an isometric view of an integrated circuit package system in another alternative embodiment of the present invention.

Referring now to FIG. 3, therein is shown an isometric view of an integrated circuit package system 300 in an embodiment of the present invention. The integrated circuit package system 300 is depicted similarly to the integrated circuit package system 200 of FIG. 2. The integrated circuit package system 300 includes a stack of devices with a first device 302 below a second device 304. The second device 304 and the first device 302 may be the same or the same type, such as functionality or technology, or may be different.

A first non-active side 306 of the first device 302 is attached to a carrier 308 with an adhesive 310. The first device 302 is in a recess 312 of the carrier 308. A side of the carrier 308 opposite the first device 302 is exposed to ambient.

First internal interconnects 314 connect a first active side 316 of the first device 302 and first external interconnects 318. Each of the first external interconnects 318 has a first lead body 320 and a first lead tip 322 extending more to the interior of the integrated circuit package system 300 than of the first lead body 320. The first internal interconnects 314 attach to the carrier 308 for ground connections or the first external interconnects 318, each at the first lead tip 322. A portion of the first lead body 320 is exposed for further connections to the next system level (not shown), such as a printed circuit board or another integrated circuit package system.

A protective coating 336 may be applied covering and protecting the first internal interconnects 314 from the second device 304, the mounting force of the second device 304, or the pressure from the encapsulating process. The protective coating 336 may be isolated to the first internal interconnects 314, the region covering the first internal interconnects 314, or the region covering the first device 302 and the first internal interconnects 314. The application of the protective coating 336 is not restricted to the integrated circuit package system 300 or the integrated circuit package system 200 having the carrier 308 as a die-attach paddle.

A second active side 324 of the second device 304 faces the first active side 316. The second device 304 is offset from the first device 302 such that the second device 304 does not perturb the connections of the first internal interconnects 314 and the first device 302. Second internal interconnects 326 connect the second active side 324 and second external interconnects 328. The second internal interconnects 326 also connect the second active side 324 and the first active side 316. The connection of the first active side 316 and the second active side 324 with the second internal interconnects 326 may serve a number of different functions, such as electrical and mechanical bridging of the integrated circuit package system 300.

Each of the second external interconnects 328 has a second lead body 330 and a second lead tip 332. The second internal interconnects 326 attach to the second external interconnects 328, each at the second lead tip 332. The offset of the second device 304 with the first device 302 creates an overhang of the second device 304 over the first device 302, a portion of the carrier 308, and the second lead tip 332. The bridge stack structure has a portion of the second internal interconnects 326 connecting the first device 302 and the second device 304 at an overlap 338 of the first device 302 and the second device 304.

An encapsulation 334, such as an epoxy mold compound, covers the first device 302, the second device 304, the first internal interconnects 314, and the second internal interconnects 326. The encapsulation 334 partially covers the first external interconnects 318, the second external interconnects 328, and the carrier 308.

The offset configuration of the first device 302 and the second device 304 forms mold lock features. The first lead tip 322, the second lead tip 332, and the recess 312 of the carrier 308 also provide mold lock functions. The interlock features improve performance in moisture level sensitivity (MSL) tests as well as increase structural rigidity. The first device 302 and the second device 304 may tested to verify known good devices (KGD) without assembly of the integrated circuit package system 300.

Figure 4:
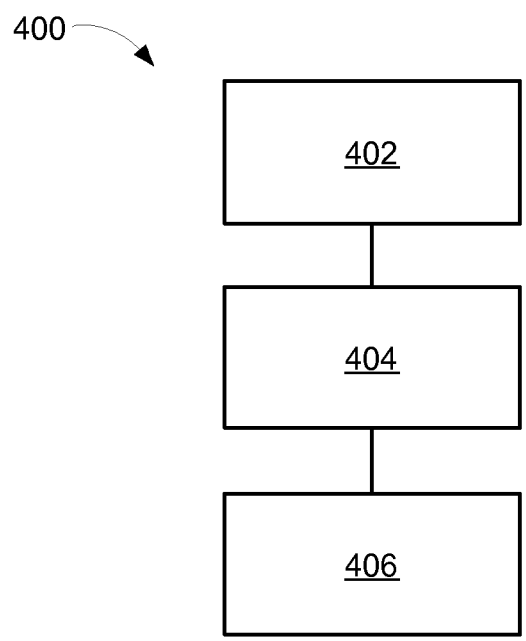
FIG. 4 is a flow chart of an integrated circuit package system for manufacture of the integrated circuit package system in an embodiment of the present invention.

Referring now to FIG. 4, therein is shown a flow chart of an integrated circuit package system 400 for manufacture of the integrated circuit package system 100 in an embodiment of the present invention. The system 400 includes mounting a first device on a carrier in a block 402; mounting a second device over the first device and the carrier in an offset face-to-face configuration in a block 404; and connecting the first device and the second device at an overlap in a block 406.

It has been discovered that the present invention thus has numerous aspects.

A principle aspect that has been unexpectedly discovered is that the present invention provides a bridge stack structure with a compact form factor for the integrated circuit package system. This bridge stack structure provides the integrated circuit package system flexible connection options between the external leads, internal devices, and between devices.

Another aspect is that the present invention provides an offset bridge stack structure allowing connections between the stacked devices in a face-to-face configuration while allowing other connections.

Yet another aspect of the present invention provides the bridge stack structure to form communication paths from various source and destinations. The communication may extend from one external lead to another using the bridge stack structure and the internal devices as redistribution structures. The bridge stack structure may provide communication paths between circuitry of the first device and the second device. The bridge stack structure may also provide communication paths between circuitry of one of the devices and external leads using the other device as a redistribution structure.

Yet another aspect of the present invention provides EMI shielding at the interior of the package with redistribution structure of the first device, the second device, or both connected to ground.

Yet another aspect of the present invention provides EMI shielding at the exterior of the package.

Yet another aspect of the present invention provides the bridge stack structure forms mold lock features of the integrated circuit package system.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system method of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
   mounting a first device on a carrier;
   mounting a second device over the first device and the carrier in an offset face-to-face configuration; and
   connecting the first device and the second device at an overlap includes coupling an entire length of a first internal interconnect, directly under the second device, between the first device and an external interconnect.

2. The method as claimed in claim 1 wherein connecting the first device and the second device at the overlap includes connecting a second internal interconnect between an interior of a first active side of the first device and the second device.

3. The method as claimed in claim 1 wherein coupling an external interconnect and the first device includes coupling a first external interconnect and a second external interconnect located on an opposite side of the carrier.

4. The method as claimed in claim 1 further comprising connecting the second device and the carrier.

5. The method as claimed in claim 1 further comprising:
   applying a protective coating around the internal interconnect.

6. A method of manufacturing an integrated circuit package system comprising:
   forming a carrier;
   mounting a first device in a recess of the carrier;
   mounting a second device over the first device and the carrier in an offset face-to-face configuration; and
   connecting the first device and the second device at an overlap including coupling an entire length of a first internal interconnect, directly under the second device, between the first device and an external interconnect.

7. The method as claimed in claim 6 wherein forming the carrier includes forming a die-attach paddle.

8. The method as claimed in claim 6 wherein forming the carrier includes forming a laminate substrate.

9. The method as claimed in claim 6 further comprising encapsulating the first device, the second device, and a portion of the carrier.

10. The method as claimed in claim 6 wherein mounting the first device includes mounting an integrated circuit die.

11. An integrated circuit package system comprising:
    a carrier;
    a first device on the carrier; and
    a second device over the first device and the carrier in an offset face-to-face configuration with the first device and the second device connected at an overlap includes an entire length of a first internal interconnect, directly under the second device, coupled between the first device and an external interconnect.

12. The system as claimed in claim 11 wherein the first device and the second device connected at the overlap has a second internal interconnect between an interior of a first active side of the first device and the second device.

13. The system as claimed in claim 11 wherein the first internal interconnect connected between an external interconnect and the first device includes the first device coupled, by bond wires, to a first external interconnect and a second external interconnect located on an opposite side of the carrier.

14. The system as claimed in claim 11 further comprising a second internal interconnect connected between the second device and the carrier includes a solder ball.

15. The system as claimed in claim 11 further comprising:
    a protective coating around the first internal interconnect.

16. The system as claimed in claim 11 wherein:
    the carrier has a recess; and
    the first device is in the recess; and further comprising:
    a second internal interconnect between the first device and the second device at the overlap.

17. The system as claimed in claim 16 wherein the carrier is a die-attach paddle.

18. The system as claimed in claim 16 wherein the carrier is a laminate substrate.

19. The system as claimed in claim 16 further comprising an encapsulation for a cover of the first device, the second device, and a portion of the carrier.

20. The system as claimed in claim 16 wherein the first device is an integrated circuit die.

* * * * *